United States Patent [19]

Wasa et al.

[11] B 4,016,061

[45] Apr. 5, 1977

[54] METHOD OF MAKING RESISTIVE FILMS

[75] Inventors: Kiyotaka Wasa, Nara; Fumio Hosomi, Higashiosaka; Shigeru Hayakawa, Hirakata, all of Japan

[73] Assignee: Matsushita Electric Industrial Co., Ltd., Osaka, Japan

[22] Filed: Jan. 16, 1974

[21] Appl. No.: 433,892

[44] Published under the second Trial Voluntary Protest Program on April 6, 1976 as document No. B 433,892.

Related U.S. Application Data

[62] Division of Ser. No. 227,070, Feb. 17, 1972, Pat. No. 3,803,057.

[30] Foreign Application Priority Data

Mar. 17, 1971  Japan .............................. 46-15273
Mar. 17, 1971  Japan .............................. 46-15274
Mar. 11, 1971  Japan .............................. 46-13829

[52] U.S. Cl. .......................... 204/192 F; 338/315
[51] Int. Cl.$^2$ ...................................... C23C 15/00
[58] Field of Search .......................... 204/192, 298

[56] References Cited

UNITED STATES PATENTS

| | | | |
|---|---|---|---|
| 3,395,089 | 7/1968 | Mayer et al. | 204/192 |
| 3,664,931 | 5/1972 | Gerstenberg | 204/298 |
| 3,736,242 | 5/1973 | Schwartz et al. | 204/192 |

*Primary Examiner*—Oscar R. Vertiz
*Assistant Examiner*—Wayne A. Langel
*Attorney, Agent, or Firm*—Wenderoth, Lind & Ponack

[57] ABSTRACT

A resistive film composition consisting essentially of AlN and solid solution of TiN and ZrN and a method of making the same by means of cathodic sputtering.

5 Claims, 7 Drawing Figures

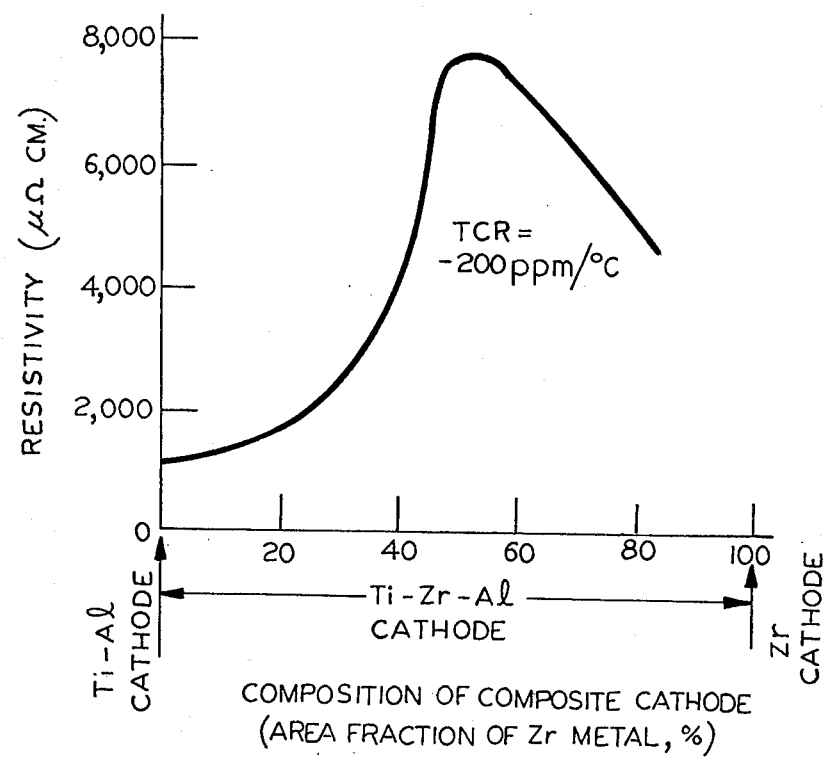
FIG. 3
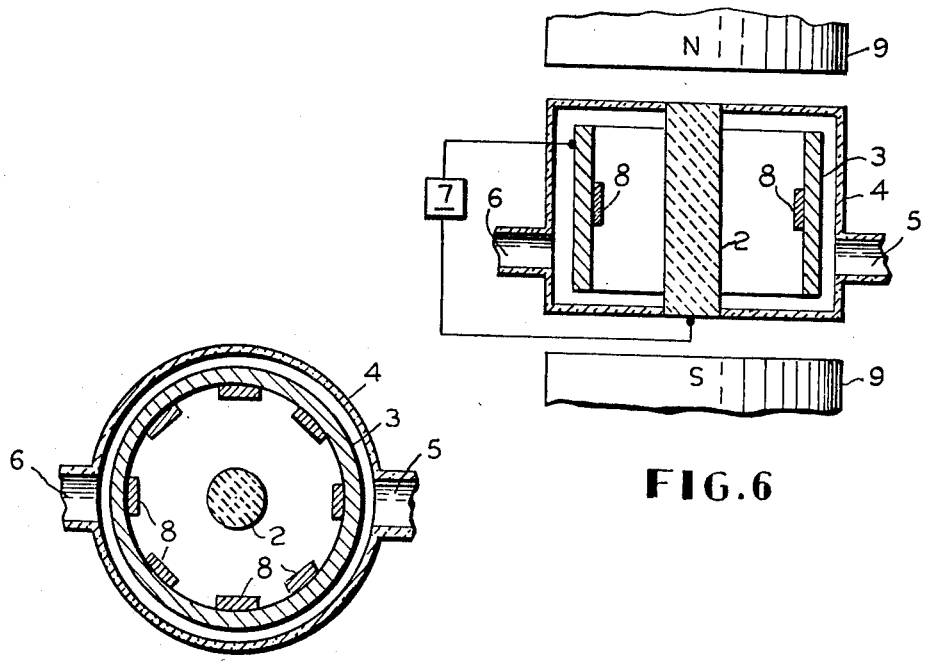
FIG. 6
FIG. 7

METHOD OF MAKING RESISTIVE FILMS

This is a division, of application Ser. No. 227,070, filed FEB. 17, 1972, now U.S. Pat. No. 3,803,057.

BACKGROUND OF THE INVENTION

1. Field of the Invention

The present invention relates to a novel resistive material for manufacturing thin film resistors and to a method of making such a material. More particularly, it relates to a resistive film composition consisting essentially of AlN and solid solution of TiN and ZrN and to a method of making this material by cathodic sputtering.

2. Description of the Prior Art

Considerable effort has been devoted to developing highly resistive thin film resistors with good electrical stability. Thin films of refractory metals, alloys, nitride silicides, oxides and metal-dielectric mixtures (cermets) have been evaluated for use in manufacturing the highly resistive thin film resistors. Among them, thin films of nitrides such as TaN and TiN having a high melting point have been felt to have practical importance in the manufacturing of the precise thin film resistors with good electric stability. However, these nitride films according to the prior art have resistances in only a narrow range, such as from 100 to 300 $\mu\Omega cm$, in specific resistivities.

The present invention provides a novel resistive material consisting essentially of AlN and a solid solution of TiN and ZrN for the manufacturing of the precise thin film resistors having a wide range of resistivities and good electrical stability. Those skilled in the art will recognize that this novel material according to the present invention is indispensable to the manufacturing of precise thin film resistors having a wide range of resistivities.

SUMMARY OF THE INVENTION

It is an object of the present invention to provide resistive materials having a novel composition for the manufacturing of precise thin film resistors having a wide range of resistivities and good electrical stability.

Another object of the present invention is to provide a novel method of making precise thin film resistors having a wide range of resistivities and good electrical stability.

Still another object of the present invention is to provide a novel electrode for cathodic sputtering for the manufacturing of precise thin film resistors having a wide range of resistivities and good electrical stability.

These objects are achieved by providing a resistor composition which is especially good for thin film resistors and having a composition consisting essentially of AlN and a solid solution of TiN and ZrN, the composition having a cermet type of structure. The material is made by electron beam deposition, ion beam deposition or cathodic sputtering on a suitable substrate.

BRIEF DESCRIPTION OF THE DRAWINGS

FIGS. 1–5 are diagrams showing the resistive properties of the thin resistive films consisting essentially of AlN and a solid solution of TiN and ZrN for various concentrations of AlN, TiN and ZrN in accordance with the present invention; and FIGS. 6 and 7 are diagrammatic view of the cathodic sputtering apparatus which is used in the method of making precise thin film resistors having a wide range of resistivities in accordance with the present invention.

DESCRIPTION OF THE PREFERRED EMBODIMENT

The resistive materials for manufacturing precise thin film resistors having a wide range of resistivities according to the present invention consist essentially of AlN and a solid solution of TiN and ZrN. The structure of said resistive materials is similar to the cermets, wherein the metallic conductor is said solid solution of TiN and ZrN and the dielectric is said AlN.

Thin resistive films of said resistive materials according to the present invention can be made by suitable methods of depositing thim films, such as by an electron beam deposition method, an ion beam deposition method or a cathodic sputtering method. For instance, said thin resistive films can be made on substrates of suitable material, such as alumina, glass or any other material having a low electrical conductivity by ion beam deposition from a composite target electrode consisting essentially of AlN, TiN and ZrN, and can also be made on said substrates by cathodic sputtering from a composite cathode consisting essentially of Al, Ti and Zr in a nitriding atmosphere.

It is preferable that the partial pressure of residual gases, including O, $O_2$, OH, $H_2O$ and hydrocarbons, be kept below $1\times10^{-6}$ Torr during deposition of said thin resistive films, and that said substrates be kept at an elevated temperature, such as 100° to 300°C during deposition of said thin resistive films. It is also preferable that said substrates be annealed after deposition of said thin resistive films in air for 5 to 10 hours at an elevated temperature, such as 250° to 300°C. Keeping the residual gases at a low partial pressure inhibits the incorporation of oxides, such as $Al_2O_3$, TiO, $TiO_2$ or $ZrO_2$, in said thin resistive films. Elevating said substrate temperature during deposition of said thin resistive films and during annealing of said substrate after deposition of said thin resistive films results in an increase in the stability of the resistive properties of said thin resistive films according to the present invention.

Figure 1:
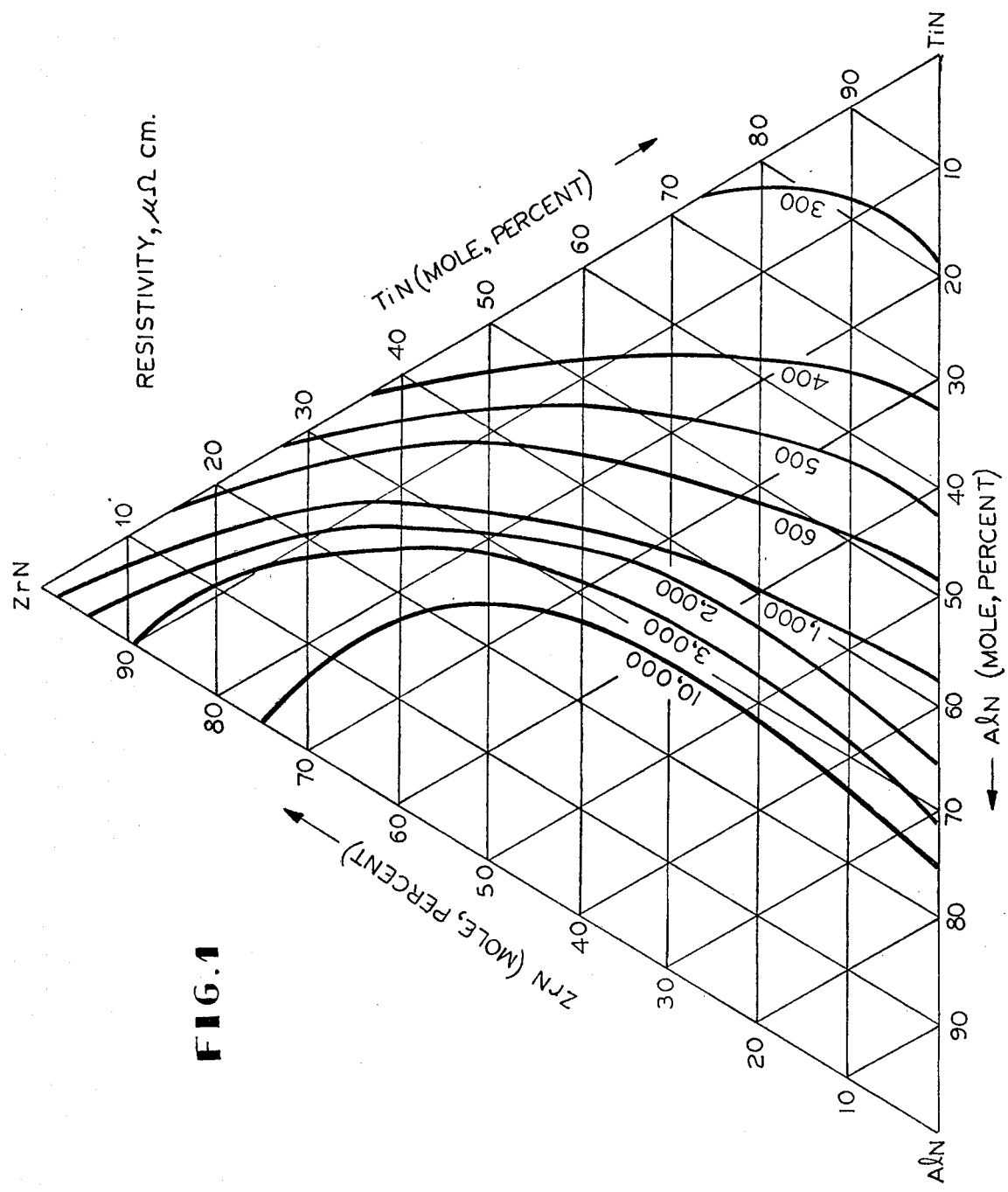
Figure 2:
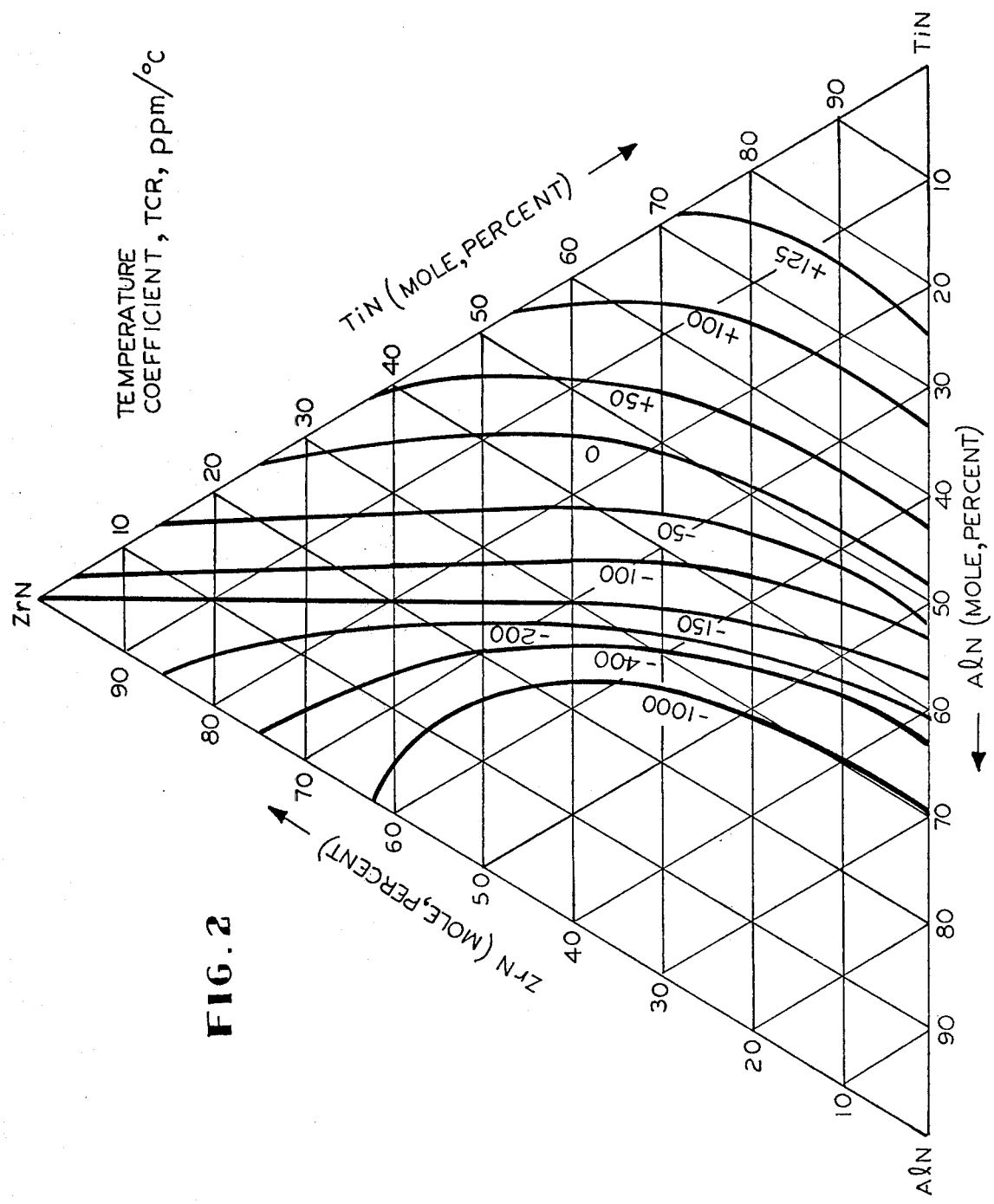

FIGS. 1 and 2 show the resistive properties of said thin resistive films consisting essentially of AlN and a solid solution of TiN and ZrN for various concentrations of AlN, TiN and ZrN when the thin resistive films are made by said cathodic sputtering. The resistivity is denoted for films having thicknesses of 800 to 3000 A on glass substrates. The temperature coefficient of resistivity is determined from the average values between 20° to 80°C. The concentrations of AlN, TiN and ZrN described are estimated by assuming that the amount of each component deposited will be proportional to a fraction of the area of the surface of said composite cathode which is of the metal of the component, and will also be proportional to the relative sputtering rate. These estimations are supported by electron micrographic analysis and the mass-spectropic analysis.

Referring to FIGS. 1 and 2, it is seen that the resistivity and the temperature coefficient of resistivity are 250 $\mu\Omega cm$ and +150 ppm/°C, respectively, for the TiN thin films. By introducing the AlN into the TiN, the resistivity of the resultant films consisting of the Ti-Al-N system increases and the temperature coefficient decreases with increasing AlN concentration. At about 50 mole % of AlN in the Ti-Al-N system, the films have a zero temperature coefficient and a resistivity of 600 $\mu\Omega$cm. At higher AlN concentrations in said Ti-Al-N system, the resistivity increases significantly. However, the temperature coefficient tends to a large negative value. For instance, at 70 mole % of AlN, the resistivity is about 3000 $\mu\Omega$cm with a temperature coefficient of $-1000$ ppm/°C.

Referring again to FIGS. 1 and 2, it is seen that the films of Ti-Zr-Al-N system can provide higher resistivity with a smaller temperature coefficient of resistivity than films of the Ti-Al-N system. FIG. 3 is a diagram showing the resistive properties of the Ti-Al-N system and the Ti-Zr-Al-N system, the amounts of material in the film resistor being proportional to the amounts of metal in the composite cathode used to form the film which is exposed on the surface of the electrode. Referring to FIG. 3, it is noteworthy that the Ti-Al-N system has a resistivity of only 1000 $\mu\Omega$cm for a material with a temperature coefficient of $-200$ ppm/°C, while the Ti-Zr-al-N system can provide a resisitivity as high as 8000 $\mu\Omega$cm for a material with the same temperature coefficient.

It has been discovered that a resistive film material consisting essentially of AlN and a solid solution of TiN and ZrN, wherein the concentration of AlN ranges from 10 to 50 mole %, the concentration of TiN ranges from 10 to 80 mole %, the concentration of ZrN ranges from 10 to 80 mole %, and the mole ratios of AlN to TiN, [AlN]/[TiN], are less than 1.2, can provide resistive films having a wide range of resistivities, such as from 350 to 10,000 $\mu\Omega$cm, with temperature coefficients of $-200$ to $+150$ ppm/°C.

It has also been discovered according to the present invention that a resistive film material consisting essentially of AlN and a solid solution of TiN and ZrN, wherein the concentration of AlN ranges from 10 to 40 mole %, the concentration of TiN ranges from 40 to 70 mole % and the concentration of ZrN ranges from 20 to 50 mole %, can provide resistive films with a very small temperature coefficient such as $+125$ to $-125$ ppm/°C with resistivities in a range of 350 to 1000 $\mu\Omega$cm.

Table 1 summarizes the typical resistive properties of the resistive films according to the present invention.

Table 1

| Film composition (mole %) | | | Resistivity ($\mu\Omega$cm) | Temperature coefficient of resistivity (ppm/°C) |
|---|---|---|---|---|
| TiN | ZrN | AlN | | |
| 100 | 0 | 0 | 250 | 150±25 |
| 54 | 0 | 46 | 600 | 0±25 |
| 29 | 67 | 4 | 600 | 0±25 |
| 30 | 55 | 15 | 1,000 | −50±25 |
| 28 | 50 | 22 | 3,000 | +150±25 |
| 25 | 50 | 25 | 7,800 | −200±25 |

Referring to Table 1, it is further noted that the resistivity of TiN films can be extended by one order or more by the introduction of ZrN and AlN.

The resistive films according to the present invention can be prepared by cathodic sputtering from a composite cathode consisting essentially of Ti, Zr and Al in a nitriding atmosphere as described hereinbefore. This causes the composite cathode materials to be nitrided so as to form mixed nitride films consisting essentially of AlN and a solid solution of TiN and ZrN on a substrate.

Figure 4:
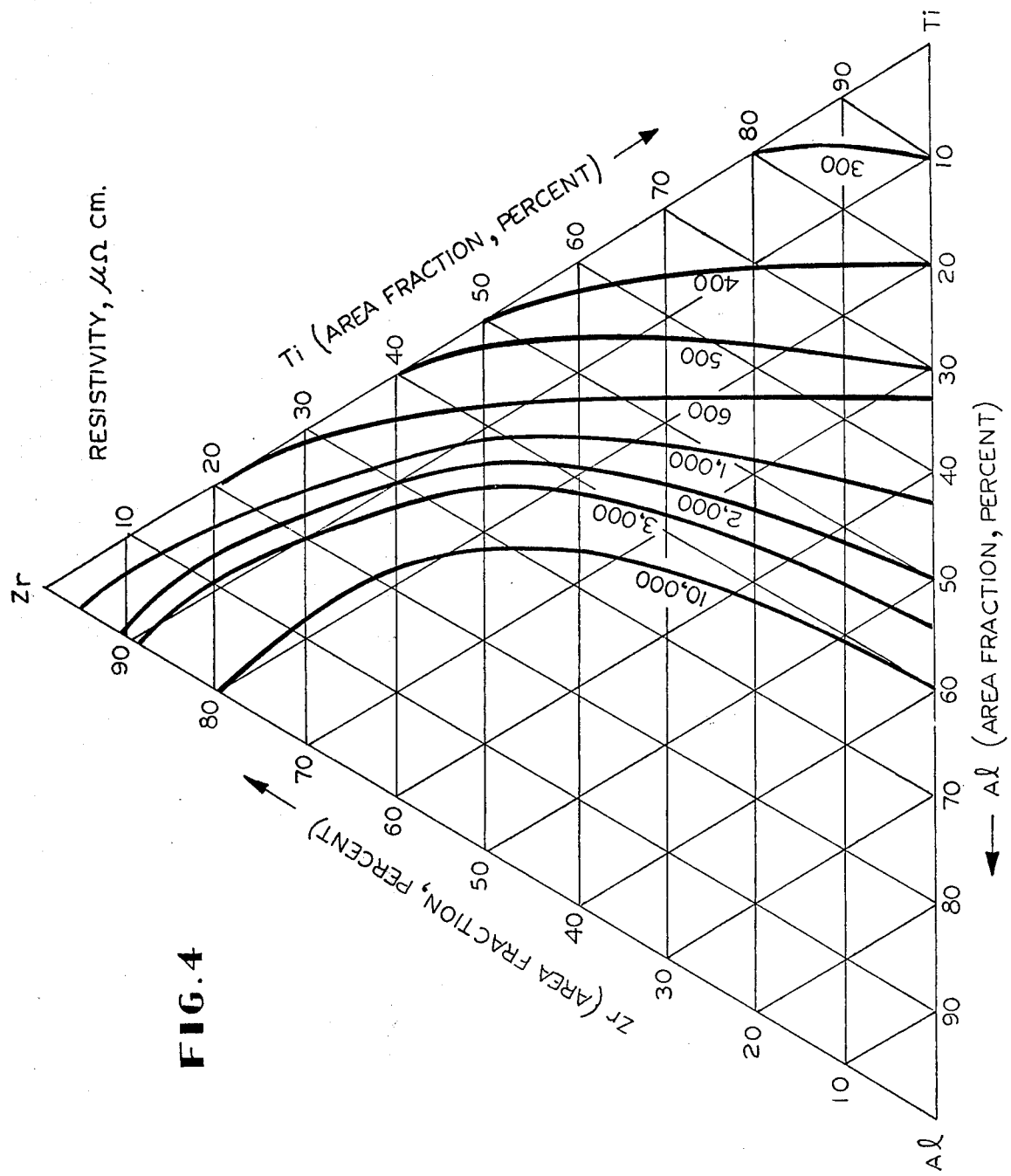
Figure 5:
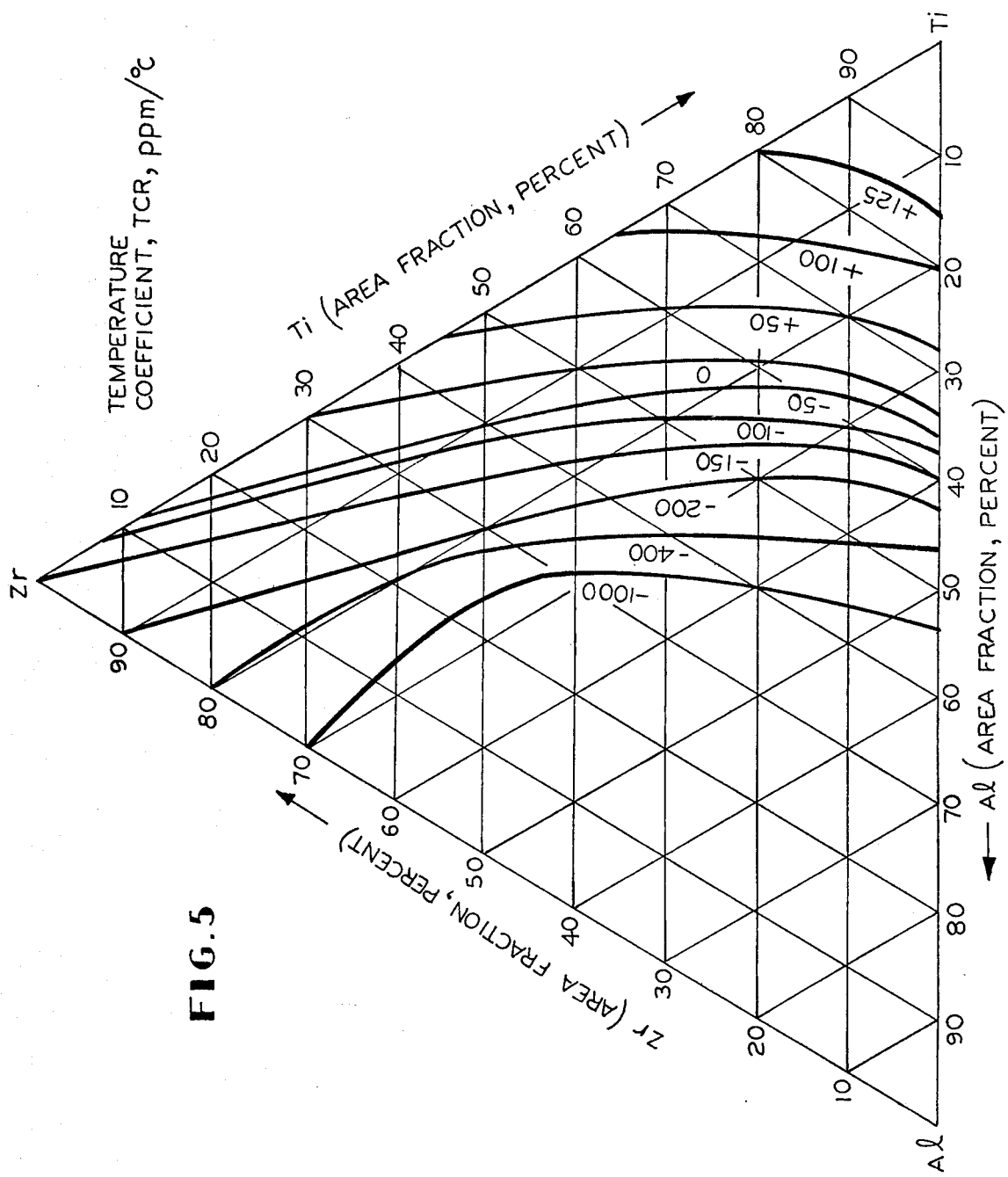

FIGS. 4 and 5 show the variation in the resistive properties of said mixed nitride films with the composition of the composite cathode. In the figures, the composition denotes the area fraction of each component on the surface of said composite cathode.

It has been discovered that the resistive films having a wide range of resistivities, such as 350 to 10,000 $\mu\Omega$cm, with temperature coefficients from $-200$ to $+150$ ppm/°C, and the composition of which consists essentially of 10 to 50 mole % of AlN, 10 to 80 mole % of TiN, 10 to 80 mole % of ZrN, and having mole ratios of AlN to TiN of less than 1.2, can be made from a composite cathode consisting essentially of Al, Ti and Zr and having a structure such that the surface area thereof is 5 to 40% Al, 15 to 85% Ti, and 10 to 80% Zr, and the ratio of the areas of Al to Ti being less than 0.7.

It has also been discovered that the resistive films having a very small temperature coefficient, such as $+125$ to $-125$ ppm/°C, and resistivities in the range of 50 to 1000 $\mu\Omega$cm, and having a composition which consists essentially of 10 to 40 mole % of AlN, 40 to 70 mole % of TiN and 20 to 50 mole % of ZrN, can be made from a composite cathode consisting essentially of Al, Ti and Zr and having a composition such that the surface area is 5 to 26% Al, 45 to 75% Ti, and 20 to 50% Zr.

It is preferable that the cathodic sputtering step be conducted at a low residual gas pressure by using a low pressure sputtering apparatus such as a magnetron type sputtering apparatus described in U.S. Pat. No. 3,528,902.

Referring to FIGS. 6 and 7, there is illustrated a magnetron type sputtering apparatus comprised of a pair of concentric cylindrical electrodes 2 and 3 mounted within a cylindrical envelope 4 having an inlet 5 and an outlet 6. Said electrodes 2 and 3 are connected across a voltage supply source 7. Either of said cylindrical electrodes 2 and 3 can be the cathode, but it is preferred that said inner electrode 2 be the cathode. Substrates 8 to be coated are secured to the anode. The cylindrical envelope 4 contains an ionizable medium and can be made of any gas-tight, nonmagnetic material.

Said cylindrical envelope 4 containing said pair of electrodes is positioned in a magnetic field parallel to the sides of said cylindrical electrodes 2 and 3 so that said field is transverse to the discharge from said electrodes. Said field can be supplied by any available magnetic field creating means 9, such as an electro-magnet externally attached across the flat end surfaces of said cylindrical envelope 4.

The ionizable medium can be nitrogen gas or a mixture of nitrogen and argon gas at a pressure of $10^{-4}$ to $10^{-3}$ Torr. The cathode is a composite cathode of Al, Ti and Zr, as described hereinbefore. Said composite cathode can be prepared by using any available and suitable method. A preferred method is to press a mixture of Al, Ti and Zr metal in powder form, the powder having a particle size of 100 to 300 mesh, at a pressure of 30,000 to 100,000 psi. Use of said magnetron type sputtering apparatus makes it possible to provide resistive films consisting essentially of AlN and a solid solution of TiN and ZrN, the resistive properties of which are as described in connection with FIGS. 1 and 2.

It has also been discovered that a low pressure sputtering apparatus such as r-f sputtering apparatus makes it possible to make thin resistive films consisting essentially of AlN and a solid solution of TiN and ZrN by using a composite cathode under low residual gas pressure.

It has also been discovered that a composite cathode consisting essentially of 10 to 50 mole % of AlN, 10 to 80 mole % of TiN, 10 to 80 mole % of ZrN, and having the mole ratio of AlN to TiN less than 1.2, can be used to make resistive films having a wide range of resistivities, such as from 350 to 10,000 $\mu\Omega$cm, and having a temperature coefficient of −200 to +150 ppm/°C, by using the cathode in an r-f sputtering process.

It has also been discovered that a composite cathode consisting essentially of 10 to 40 mole % of AlN, 40 to 70 mole % of TiN and 20 to 50 mole % of ZrN can be used to make resistive films with a very small temperature coefficient, such as from +125 to −125 ppm/°C, and having resistivities in a range of 350 to 1000 $\mu\Omega$cm, by using said cathode in an r-f sputtering process.

Such a composite cathode consisting essentially of TiN, ZrN and AlN can also be used to make resistive films according to the present invention by using the cathode in any other available method of cathodic disintegration, such as an ion beam deposition process as described hereinbefore.

The electrical stability of the resistance of the resistive films according to the present invention is found to be better than 0.1% after 1000 hours in a test at 80°C with no load, which is the same order of stability as that for TiN films. The noise level depends somewhat on the film composition. The typical values observed are −20 to −30 db with 2 to 3 mW/mm². The resistive films according to the present invention can be anodized in an electrolyte consisting of ammonium borate and ethylene glycol with a 4 to 16 A/Volt oxidation rate. By using the anodizing process, the present resistive films, like TiN films, can be protected from aging, and at the same time can be trimmed accurately. These facts suggest that the present novel resistive film materials have a high potential not only for use in manufacturing precise thin film resistors in a wide range of resistivities and having high electrical stability, but in the manufacturing of hybrid circuit elements for microelectronics.

What is claimed is:

1. A method of making a thin resistive film comprising cathodically sputtering the thin resistive film onto a substrate from a composite cathode consisting essentially of Al, Ti and Zr and having a structure such that the surface area is 5 to 40% Al, 15 to 85% Ti and 10 to 80% Zr, the ratio of the area Al to Ti being less than 0.7, in a nitriding atmosphere at a pressure of $10^{-4}$ to $10^{-3}$ Torr.

2. A method of making a thin resistive film as claimed in claim 1, wherein said composite cathode has a structure such that the surface area is 5 to 26% of Al, 45 to 75% of Ti and 20 to 50% of Zr.

3. A method of making a thin resistive film comprising cathodically sputtering the thin resistive film onto a substrate from a composite cathode consisting essentially of 10 to 50 mole % of AlN, 10 to 80 mole % of ZrN and 10 to 80 mole % of TiN, the mole ratio of the AlN to TiN being less than 1.2, in a non-reactive gas at a pressure of $10^{-4}$ to $10^{-3}$ Torr.

4. A method of making a thin resistive film as claimed in claim 3, in which the non-reactive gas is argon.

5. A method of making a thin resistive film as claimed in claim 3, wherein said composite cathode consists essentially of 10 to 40 mole % of AlN, 20 to 50 mole % of ZrN and 40 to 70 mole % of TiN.

* * * * *